(12) United States Patent
Chang et al.

(10) Patent No.: US 7,075,849 B2
(45) Date of Patent: Jul. 11, 2006

(54) SEMICONDUCTOR MEMORY DEVICE AND LAYOUT METHOD THEREOF

(75) Inventors: Soo-Bong Chang, Seoul (KR); Jung-Hwa Lee, Gyeonggi-do (KR); Chi-Wook Kim, Gyeonggi-do (KR); Byong-Mo Moon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 10/786,855

(22) Filed: Feb. 24, 2004

(65) Prior Publication Data

US 2004/0208077 A1 Oct. 21, 2004

(30) Foreign Application Priority Data

Apr. 16, 2003 (KR) ...................... 10-2003-0024123

(51) Int. Cl.
*G11C 7/00* (2006.01)
*G11C 8/00* (2006.01)
(52) U.S. Cl. ............. 365/226; 365/189.07; 365/230.06
(58) Field of Classification Search ................ 365/226, 365/227, 230.03, 230.06, 189.07
See application file for complete search history.

(56) References Cited

U.S. PATENT DOCUMENTS

| | | | | | |
|---|---|---|---|---|---|
| 5,396,113 | A | * | 3/1995 | Park et al. ................... | 365/226 |
| 5,814,851 | A | * | 9/1998 | Suh ............................. | 365/226 |
| 5,862,096 | A | * | 1/1999 | Yasuda et al. ............... | 365/227 |
| 6,021,082 | A | * | 2/2000 | Shirai ......................... | 365/226 |
| 6,064,621 | A | * | 5/2000 | Tanizaki et al. ............ | 365/226 |
| 6,314,035 | B1 | * | 11/2001 | Kitade et al. .......... | 365/230.06 |
| 6,385,115 | B1 | * | 5/2002 | Nakai .......................... | 365/226 |
| 6,496,438 | B1 | * | 12/2002 | Saito ........................... | 365/226 |
| 6,504,783 | B1 | * | 1/2003 | Jo ............................... | 365/226 |
| 6,535,447 | B1 | * | 3/2003 | Kim et al. ................... | 365/226 |
| 6,549,480 | B1 | * | 4/2003 | Hosogane et al. .......... | 365/226 |
| 6,560,158 | B1 | * | 5/2003 | Choi et al. .................. | 365/226 |
| 6,680,875 | B1 | * | 1/2004 | Horiguchi et al. .......... | 365/227 |

* cited by examiner

*Primary Examiner*—Trong Phan
(74) *Attorney, Agent, or Firm*—Marger Johnson & McCollom, P.C.

(57) ABSTRACT

Embodiments of the invention provide drivers from active internal voltage generating circuits on both sides of the internal voltage generating lines, therefore a voltage level of the internal voltage generating lines can quickly and uniformly reach a desired internal voltage level. Other embodiments of the invention are described in the claims.

15 Claims, 5 Drawing Sheets

SEMICONDUCTOR MEMORY DEVICE AND LAYOUT METHOD THEREOF

CROSS REFERENCE TO RELATED APPLICATIONS

This application claims priority from Korean Patent Application 2003-24123 filed on Apr. 16, 2003, the entire contents of which is hereby incorporated by reference.

BACKGROUND OF THE INVENTION

1. Field of the Invention

This disclosure relates to a semiconductor memory device, and more particularly to a semiconductor memory device which can uniformly change a voltage level of an internal voltage generating line and a layout method thereof.

2. Description of Related Art

An internal voltage generating circuit of a conventional semiconductor memory device includes an internal voltage generating circuit for a memory cell array and an internal voltage generating circuit for a peripheral circuit.

Each of the internal voltage generating circuits includes a standby internal voltage generating circuit which operates in both a standby mode and an active mode and an active internal voltage generating circuit which operates in only an active mode.

The active internal voltage generating circuit of the internal voltage generating circuit for a memory cell array supplies an internal voltage to a PMOS bit line sense amplifier which senses and amplifies a voltage of a bit line.

FIG. 1 is a block diagram illustrating a layout of a conventional semiconductor memory device. The semiconductor memory device of FIG. 1 includes a memory cell array 10, a column decoder 12, a column control circuit 14, a row decoder 16, a standby internal voltage generating circuit 18, an active internal voltage generating circuit 20, and drivers 20-1 to 20-3.

In FIG. 1, SIVC stands for the standby internal voltage generating circuit 18, AIVC stands for the active internal voltage generating circuit 20, D stands for the drivers 20-1 to 20-3, and 22 represents an external voltage applying pad 22. WL stands for one representative word line, BL stands for one representative bit line, and CSL stands for one representative column selecting line.

In FIG. 1, the memory cell array 10 includes four memory cell array blocks 10-1 to 10-4. Each of the memory cell array blocks 10-1 to 10-4 includes four sub memory cell array blocks MCA. A sub word line driver SWD is arranged between two adjacent memory cell array blocks MCA that are vertically aligned, and a bit line sense amplifier SA is arranged between two adjacent memory cell array blocks MCA that are horizontally aligned. Since the bit line sense amplifier SA is shared by the memory cell array blocks MCA arranged on its right and left sides, there is no need that it is arranged between all memory cell array blocks MCA. Each of the drivers 20-1 to 20-3 is arranged on a left side of the memory cell array 10 adjacent to the respective sub word line drivers SWD (i.e., location opposite to the column decoder 12), and each of internal voltage generating lines VINTA1 to VINTA3 is arranged to extend from an area where the respective sub word line drivers SWD is arranged. The internal voltage generating lines VINTA1 to VINTA3 are commonly connected to an internal voltage generating line VINTA.

However, since the active internal voltage generating circuit 20 and the drivers 20-1 to 20-3 of the conventional semiconductor memory device shown in FIG. 1 are arranged on one side of the memory cell array 10, the resistance of the internal voltage generating lines VINTA1 to VINTA3 becomes greater as the distance from the drivers 20-1 to 20-3 increases. Therefore, when the drivers 20-1 to 20-3 supply an internal voltage to the internal voltage generating lines VINTA1 to VINTA3 in an active mode, the farther it is from the drivers 20-1 to 20-3, the more a level of the internal voltage VCCA drops.

The internal voltage VCCA supplied to the internal voltage generating lines VINTA1 to VINTA3 are applied to the bit line sense amplifiers SA in an active mode and is used to amplify data of the bit line to an internal voltage VCCA level in a write/read mode. However, if the level of the internal voltage generating lines VINTA1 to VINTA3 is not raised up to an internal voltage VCCA level in an active mode, there is a problem in that data of the bit line cannot be amplified up to an internal voltage VCCA level in a write/read mode.

However, in the conventional semiconductor memory device of FIG. 1, the voltage level of the internal voltage generating lines VINTA1 to VINTA3 drops the further the line becomes from the drivers 20-1 to 20-3, and thus the sensing ability of the bit line sense amplifier SA arranged at a location far from the drivers 20-1 to 20-3 is degraded.

For the foregoing reasons, when a semiconductor memory device is designed that places the bit line sense amplifier SA far from the drivers 20-1 to 20-3, there is a problem in that a time period (tRCD) from a time point that an active command is applied to perform an active operation to a time point that a write/read command is applied to perform a write/read operation (an internal time period until a column selecting line CSL can be selected after a word line is enabled) becomes lengthy. That is, the semiconductor memory device is designed such that a write/read operation is performed after a level of the internal voltage generating lines VINTA1 to VINTA3 arranged at a location far from the drivers 20-1 to 20-3 reaches a desired internal voltage level. This delay becomes a significant obstacle in designing a high speed semiconductor memory device.

Embodiments of the invention address these and other disadvantages of the prior art.

SUMMARY OF THE INVENTION

Embodiments of the invention provide a semiconductor memory device and a layout method thereof which can uniformly change a level of internal voltage generating lines to a desired internal voltage level as fast as possible, thereby improving a time period (tRCD).

BRIEF DESCRIPTION OF THE DRAWINGS

For a more complete understanding of the invention and the advantages thereof, reference is now made to the following descriptions taken in conjunction with the accompanying drawings, in which like reference numerals denote like parts.

DETAILED DESCRIPTION OF THE INVENTION

Reference will now be made in detail to preferred embodiments of the invention, examples of which are illustrated in the accompanying drawings.

Figure 2:
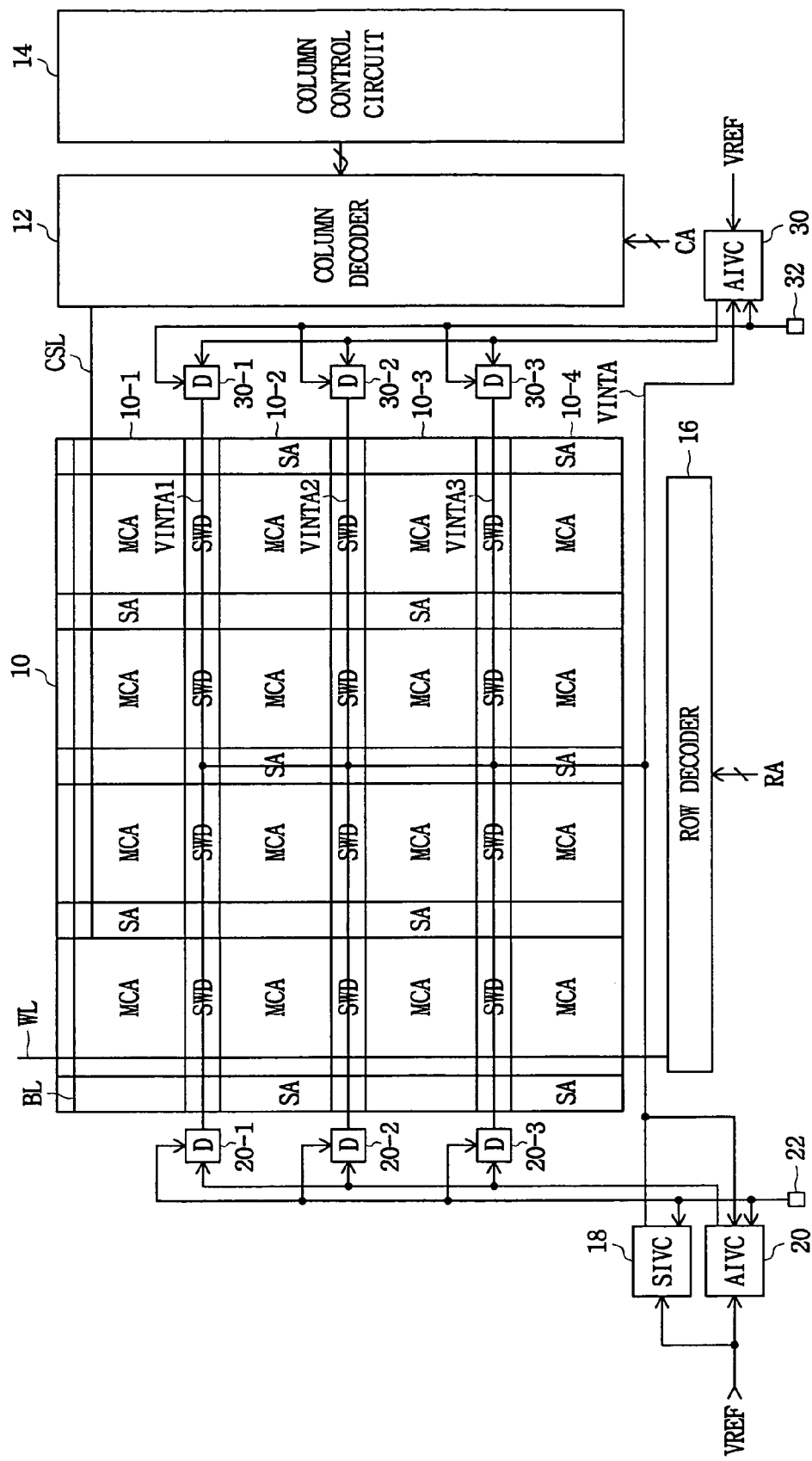
FIG. 2 is a block diagram illustrating a layout of a semiconductor memory device according to some embodiments of the invention.

FIG. 2 is a block diagram illustrating a layout of a semiconductor memory device according to some embodiments of the invention.

Figure 1:
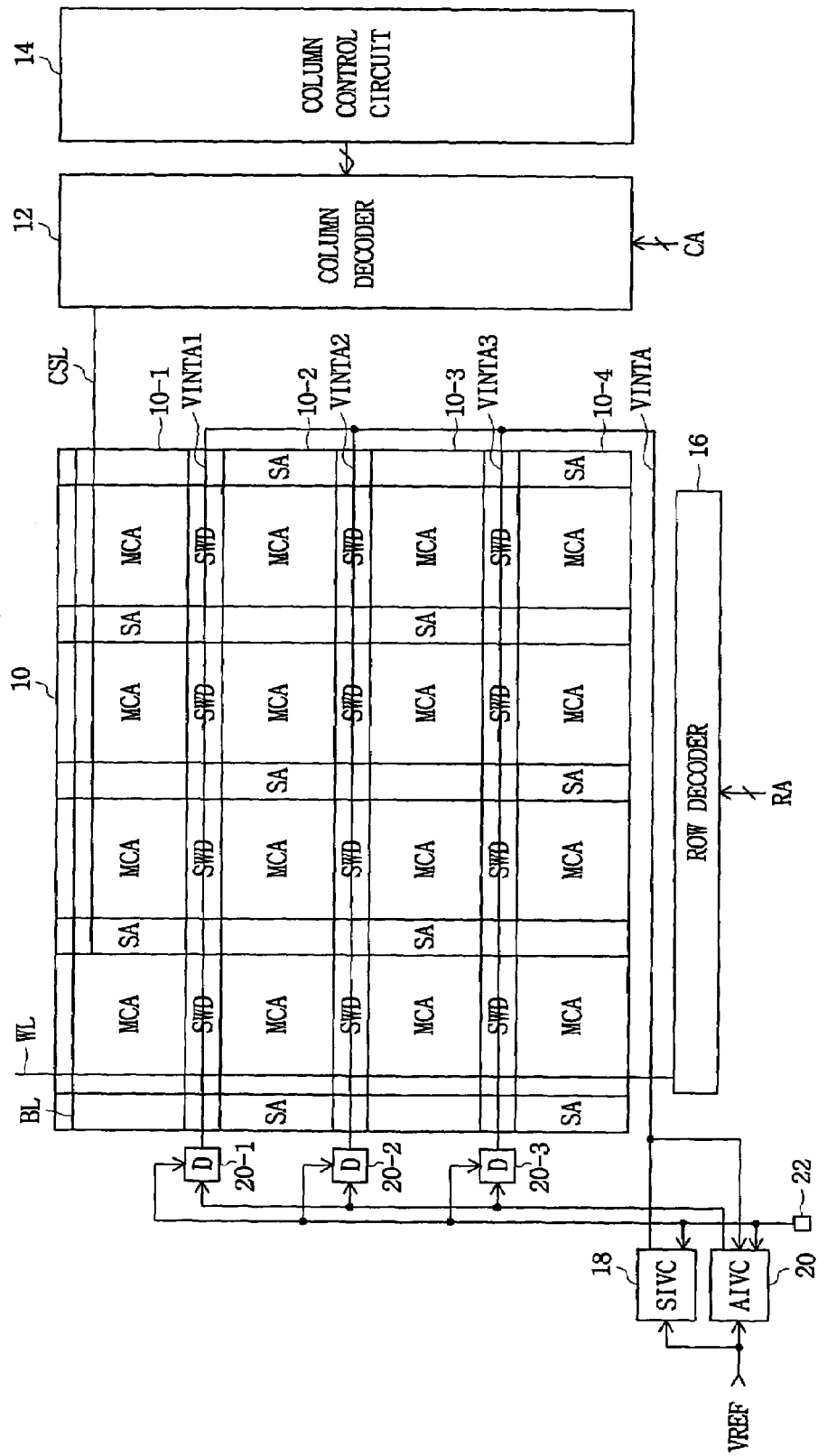
FIG. 1 is a block diagram illustrating a layout of a conventional semiconductor memory device.

In addition to components shown in FIG. 1, the semiconductor memory device of FIG. 2 includes an active internal voltage generating circuit 30 (AIVC 30), drivers 30-1, 30-2, and 30-3, and another external voltage applying pad 32.

Like reference numerals in FIGS. 1 and 2 denote like parts that perform the same operations. Thus, an explanation of the parts in FIG. 2 that have already been described in with reference to FIG. 1 will be omitted.

In FIG. 2, the AIVC 30 is arranged on the same side of the semiconductor memory device that the column decoder 12 is arranged, and the drivers 30-1 to 30-3 are also arranged on the same side of the semiconductor memory device as the column decoder 12. In other words, the AIVC 30 and the drivers 30-1 to 30-3 are arranged on a side opposite to the AIVC 20 and the drivers 20-1 to 20-3. The drivers 30-1 to 30-3 and the drivers 20-1 to 20-3 are symmetrically arranged on either side of the memory cell array 10 that is interposed therebetween.

That is, the semiconductor memory device of FIG. 2 is configured such that the active internal voltage generating circuit 20 and the drivers 20-1 to 20-3 are arranged on one side thereof, and the active internal voltage generating circuit 30 and the drivers 30-1 to 30-3 which have the same configuration as the active internal voltage generating circuit 20 and the drivers 20-1 to 20-3 respectively are arranged on the other side thereof.

Therefore, the semiconductor memory device can reduce a level difference of an internal voltage according to a location of the internal voltage generating lines VINTA1 to VINTA3 by supplying an internal voltage VCCA from both sides of the internal voltage generating lines VINTA1 to VINTA3 in an active mode. Also, a level of the internal voltage generating lines VINTA1 to VINTA3 can rapidly reach a desired internal voltage VCCA level by supplying an internal voltage VCCA from both sides of the internal voltage generating lines VINTA1 to VINTA3, thereby reducing the time period tRCD.

Further, by additionally arranging the external voltage pad 32 adjacent to the active internal voltage generating circuit 30 independently from the external voltage pad 22, the active internal voltage generating circuit 30 may be operated at the same time as the active internal voltage generating circuit 20 to thereby rapidly supply an internal voltage VCCA level to the internal voltage generating lines VINTA1 to VINTA3 in an active mode.

Figure 3:
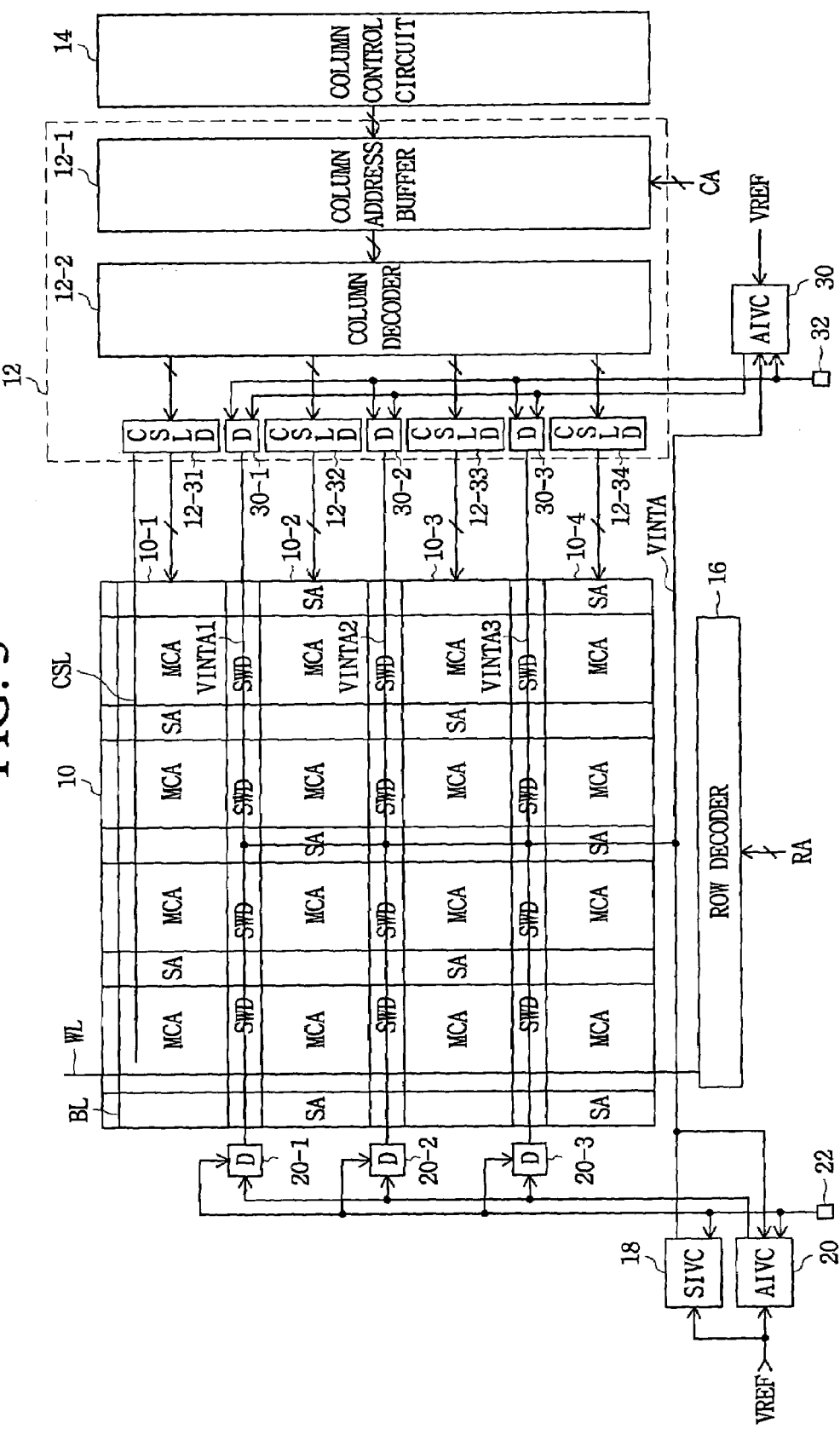
FIG. 3 is a block diagram illustrating a modified layout of a semiconductor memory device according to some embodiments of the invention.

FIG. 3 is a block diagram illustrating a modified layout of a semiconductor memory device according to some embodiments of the invention. In FIG. 3, the drivers 30-1 to 30-3 are arranged within the column decoder 12.

Like reference numerals of FIGS. 2 and 3 denote like parts. CSLD stands for a column selecting line driver.

The column decoder 12 of the semiconductor memory device of FIG. 3 includes a column address buffer 12-1, a column pre-decoder 12-2, and CSLDs 12-31 to 12-34. The drivers 30-1 to 30-3 are arranged between the CSLDs 12-31 to 12-34.

That is, as described in FIG. 3, the drivers 30-1 to 30-3 are arranged in empty spaces between the CSLDs 12-31 to 12-34 in column decoder 12, thereby the layout area size of the semiconductor memory device is not increased.

The function of components of the column decoder 12 is explained below.

The column address buffer 12-1 buffers a column address CA to generate a buffered column address when a write/read command is applied. The column pre-decoder 12-2 pre-decodes the buffered column address by a predetermined bit to generate a pre-decoded column address. Each of the column selecting line drivers 12-31 to 12-34 drives column selecting lines CSL for selecting bit lines of each of the memory cell array blocks 10-1 to 10-4 in response to the pre-decoded column address.

The column control circuit 14 includes a control signal generating circuit for controlling the column decoder 12 and a redundancy circuit for replacing an inferior memory cell of the memory cell array with a redundant memory cell (not shown).

Operation of the semiconductor memory devices of FIGS. 2 and 3 is explained below.

When an active command is applied, the row decoder 16 decodes a row address RA to generate a word line selecting signal for selecting the word line. A charge sharing operation is performed between all memory cells connected to the selected word line and the bit line. The active internal voltage generating circuits 20 and 30 compares a reference voltage VREF to a voltage of the internal voltage generating line VINTA. The drivers 20-1 to 20-3 and 30-1 to 30-3 have driving ability according to an output voltage level of the active internal voltage generating circuits 20 and 30 and so maintain a voltage level of the internal voltage generating lines VINTA1 to VINTA3 at an internal VCCA voltage level. Here, since the internal voltage generating lines VINTA1 to VINTA3 are simultaneously driven from both sides of the memory cell array 10, the voltage level of the internal voltage generating lines VINTA1 to VINTA3 can be uniformly maintained and can rapidly reach the internal voltage VCCA level. After a charge sharing operation is performed between the memory cells connected to the selected word line and the bit line, the bit line sense amplifier SA operates and then senses and amplifies data of the bit line. Here, a level of an internal voltage VCCA applied to the bit line sense amplifier SA is maintained at a uniform internal voltage VCCA level regardless of location of the internal voltage generating lines VINTA1 to VINTA3 and thus rapidly amplifies data of the bit line.

When a write/read command is applied, the column decoder 12 decodes a column address CA to generate a column selecting line selecting signals for selecting the column selecting line CSL. Here, the column selecting line selecting signals are generated at a time after the bit line sensing operation performed by the bit line sense amplifiers SA is complete. Therefore, if the bit line sensing operation is rapidly performed, it is possible to rapidly generate the column selecting line selecting signals. When the column selecting line selecting signals are generated, data of the selected bit line is written/read in response to the column selecting line selecting signals.

That is, the semiconductor memory device maintains the level of the internal voltage generating lines VINTA1 to VINTA3 at a desired internal voltage level regardless of the location of the lines, whereby the bit line sense amplifiers can rapidly amplify to a desired level. Therefore, the time period tRCD from a time point that an active command is applied to a time point that a write/read command is applied is decreased, and high speed operation is possible.

In FIGS. 2 and 3, the drivers 30-1 to 30-3 are arranged in the column decoder or adjacent to the column decoder 12 (as shown), but the drivers 30-1 to 30-3 may also be arranged in the column control circuit 14. In this case, the drivers 30-1 to 30-3 are still arranged on an opposite side of the memory cell array 10 to the drivers 20-1 to 20-3. In order to prevent the increase of the layout area size, it is preferable to arrange the drivers 30-1 to 30-3 on empty spaces.

Figure 4:
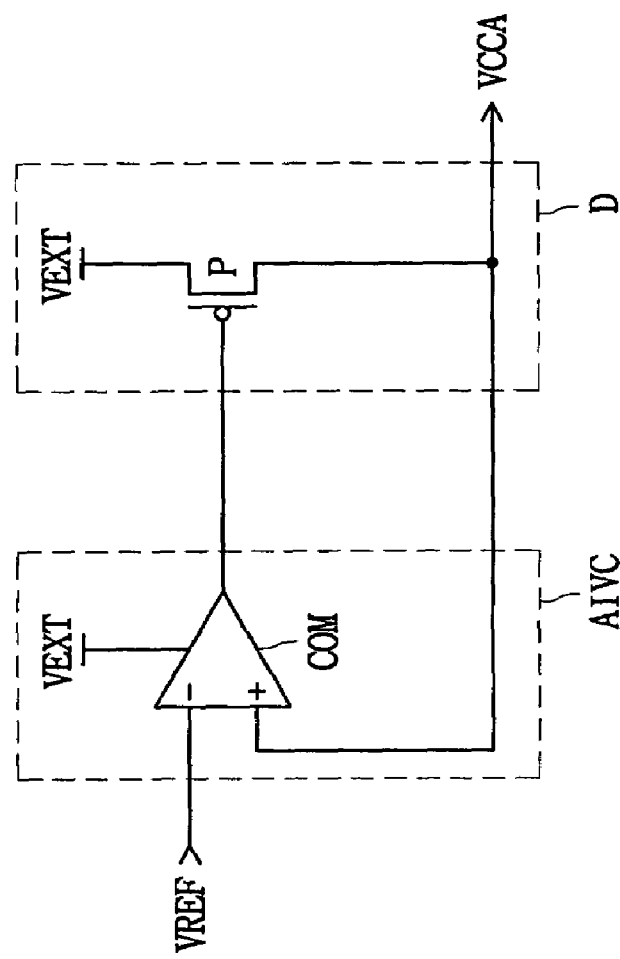
FIG. 4 is a circuit diagram illustrating an active internal voltage generating circuit and a driver of the semiconductor memory device according to some embodiments of the invention.

FIG. 4 is a circuit diagram illustrating an active internal voltage generating circuit (AIVC) and a driver (D) of the semiconductor memory device according to some embodiments of the invention. The AIVC includes a comparator COM, and the driver D includes a PMOS transistor P1.

Operation of the active internal voltage generating circuit and the driver of FIG. 4 is explained below.

The comparator COM compares a reference voltage VREF to an internal voltage VCCA to raise the level of the comparator output voltage when the internal voltage VCCA is higher than the reference voltage VREF and to lower the level of the comparator output voltage when the internal voltage VCCA is lower than the reference voltage VREF. The PMOS transistor P increases the driving ability to raise the level of the internal voltage VCCA when a level of the comparator output voltage output from the comparator COM becomes lower or decreases the driving ability to lower the level of the internal voltage VCCA when a level of the comparator output voltage output from the comparator COM becomes higher.

The AIVC operates in the method descried above to maintain a level of the internal voltage VCCA to a reference voltage VREF level.

Figure 5:
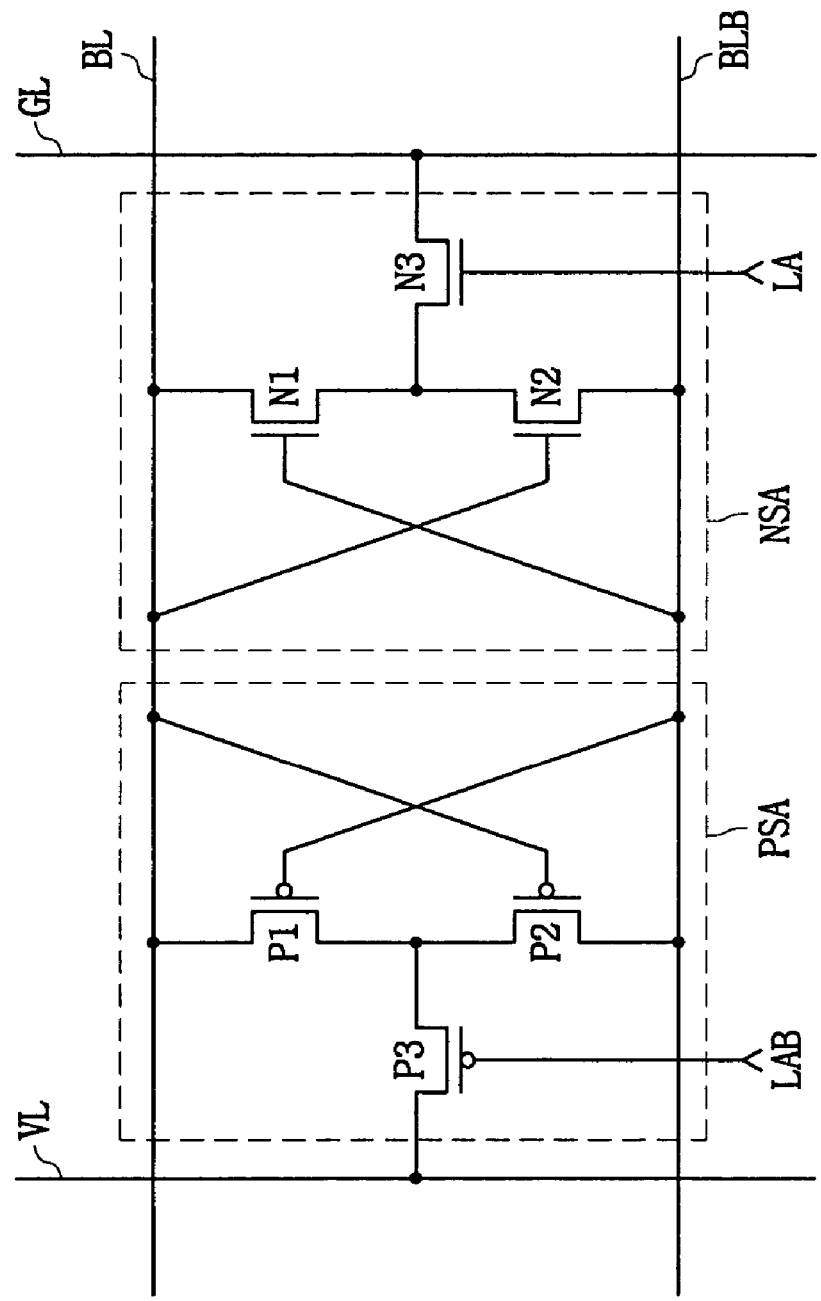
FIG. 5 is a circuit diagram illustrating a bit line sense amplifier of the semiconductor memory device according to some embodiments of the invention.

FIG. 5 is a circuit diagram illustrating an example bit line sense amplifier of the semiconductor memory device according to some embodiments of the invention. The bit line sense amplifier of FIG. 5 includes a PMOS sense amplifier PSA having PMOS transistors P1, P2, and P3 and an NMOS sense amplifier NSA having NMOS transistors N1, N2, and N3.

In FIG. 5, BL and BLB represent a bit line pair, VL represents an internal voltage applying line connected to the internal voltage generating line, and GL represents a ground voltage line. Also, LAB is a control signal for enabling the PMOS sense amplifier PSA, and LA is a control signal for enabling the NMOS sense amplifier NSA.

The internal voltage applying line VL of FIG. 5 is arranged in a perpendicular direction to the internal voltage generating lines VINTA1 to VINTA3.

Operation of the bit line sense amplifier of FIG. 5 is explained below.

When a control signal LAB having a "low" level and a control signal LA having a "high" level are generated, the PMOS transistor P3 is turned on to amplify data of the bit line pair BL and BLB to an internal voltage VCCA level in response to data having a "low" level of the bit line pair BL and BLB. Also, the NMOS transistor N3 is turned on to amplify data of the bit line pair BL and BLB to a ground voltage level in response to data having a "high" level of the bit line pair BL and BLB.

Here, since an internal voltage VCCA level is uniform regardless of the location of the internal voltage generating lines VINTA1 to VINTA3, the bit line sense amplifier can amplify to a desired internal voltage VCCA level regardless of location of the bit line sense amplifier when a bit line sensing operation is performed.

In the embodiments described above, a layout method of the semiconductor memory device is explained with emphasis on a semiconductor memory device having a sub word line configuration. However, embodiments of the invention may also include semiconductor memory devices having no sub word line configuration.

Embodiments of the invention can quickly and uniformly bring the voltage level of the internal voltage generating lines to a desired internal voltage level by arranging the drivers of the active internal voltage generating circuit on both sides of the internal voltage generating lines.

Therefore, embodiments of the invention can rapidly amplify the bit line to a desired internal voltage level, thereby improving the time period tRCD which directly affects the operation speed of the semiconductor memory device.

Some embodiments of the invention will now be described in a non-limiting way.

Some embodiments of the invention provide a semiconductor memory device, including: a memory cell array with word lines arranged in a row direction, bit lines and column selecting lines arranged in a column direction, and a plurality of memory cell array blocks arranged in a column direction; a plurality of internal voltage generating lines arranged between the plurality of the memory cell array blocks; a column decoder arranged on one side of the memory cell array and decoding a column address to select the column selecting lines; an internal voltage generating circuit arranged on both sides of the memory cell array and comparing a reference voltage to an internal voltage to generate a comparing signal; and a plurality of drivers arranged on both ends of the plurality of the internal voltage generating lines and respectively supplying the internal voltage to the plurality of the internal voltage generating lines in response to the comparing signal.

The plurality of drivers includes a plurality of first drivers arranged on one end of the plurality of the internal voltage generating lines to supply the internal voltage to the plurality of the internal voltage generating lines; and a plurality of second drivers arranged on the other end of the plurality of the internal voltage generating lines to supply the internal voltage to the plurality of the internal voltage generating lines.

Embodiments of the invention further include a first external voltage applying pad for applying an external voltage to the plurality of the first drivers; and a second external voltage applying pad for applying the external voltage to the plurality of the second drivers.

Embodiments of the invention also provide a layout method for a semiconductor memory device, including: arranging a plurality of memory cell array blocks of a memory cell array in a column direction; arranging a plurality of internal voltage generating lines between the plurality of the memory cell array blocks; arranging a column decoder on one side of the memory cell array; arranging an active internal voltage generating circuit on both sides of the memory cell array; and arranging a plurality of drivers of the active internal voltage generating circuit on both sides of the plurality of the internal voltage generating lines.

Arranging the plurality of drivers includes arranging a plurality of first drivers of the active internal voltage generating circuit on one side of the plurality of the internal voltage generating lines; arranging a plurality of second drivers of the active internal voltage generating circuit on the other side of the plurality of the internal voltage generating lines; and arranging separately a first external voltage applying pad for applying an external voltage to the plurality of the first drivers and a second external voltage applying pad for applying the external voltage to the plurality of the second drivers.

While the invention has been particularly shown and described with reference to preferred embodiments thereof, it will be understood by those skilled in the art that the foregoing and other changes in form and details may be made therein without departing from the spirit and scope of the invention.

We claim:

1. A semiconductor memory device comprising:
a memory cell array including word lines arranged in a row direction, bit lines and column selecting lines arranged in a column direction, and memory cell array blocks arranged in the column direction;
internal voltage generating lines arranged between the memory cell array blocks;
a column decoder arranged on a first side of the memory cell array and configured to select one of the column selecting lines;
a first and a second internal voltage generating circuit arranged on the first side and a second side, respectively, of the memory cell array, the first and second internal voltage generating circuits configured to compare a reference voltage to an internal voltage and to generate a comparing signal, the comparing signal different from the internal voltage; and
drivers arranged on both ends of the internal voltage generating lines, respectively, and configured to supply the internal voltage to the internal voltage generating lines in response to the comparing signal.

2. The device of claim 1, the drivers comprising:
first drivers coupled to the internal voltage generating lines On the first side of the memory cell array; and
second drivers coupled to the internal voltage generating lines on the second side of the memory cell array.

3. The device of claim 2, further comprising:
a first external voltage applying pad configured to apply an external voltage to the first drivers; and
a second external voltage applying pad configured to apply the external voltage to the second drivers.

4. The device of claim 3, further comprising:
a first external voltage applying pin configured to apply the external voltage to the first external voltage applying pad; and
a second external voltage applying pin configured to apply the external voltage to the second external voltage applying pad.

5. The device of claim 2, the column decoder comprising:
a column address input buffer for receiving and buffering the column address;
a column address pre-decoder for pre-decoding the buffered column address; and
column selecting line driving circuits for driving the column selecting lines in response to the pre-decoded column address, wherein the second drivers are arranged between the column selecting line driving circuits.

6. A device comprising:
a memory cell array having a first and a second memory cell array block;
an internal voltage generating line arranged between the first and the second memory cell array blocks;
a first and a second active internal voltage generating circuit arranged on a first and second side, respectively, of the memory cell array, the first and second active internal voltage generating circuits configured to output a comparison signal that is generated by a comparator, the comparator configured to generate the comparison signal based upon the difference between a reference voltage and an internal voltage; and
a first and a second driver coupled to the first and the second active internal voltage generating circuits, respectively, and coupled to a first and a second end, respectively, of the internal voltage generating line, the first and second drivers configured to supply the internal voltage to the internal voltage generating line in response to the comparison signal.

7. The device of claim 6, further comprising:
a first external voltage pad configured to apply an external voltage to the first driver; and
a second external voltage pad configured to apply the external voltage to the second driver.

8. The device of claim 7, further comprising:
a first external voltage pin coupled to the first external voltage pad; and
a second external voltage pin coupled to the second external voltage pad, the second external voltage pin separated from the first external voltage pin.

9. A method of fabricating a semiconductor memory device, the method comprising:
arranging memory cell array blocks of a memory cell array in a column direction;
arranging internal voltage generating lines between the memory cell array blocks;
arranging a column decoder adjacent to a first side of the memory cell array;
arranging a first active internal voltage generating circuit adjacent to the first side of the memory cell array, the first active internal voltage generating circuit including a first comparator;
arranging a second active internal voltage generating circuit adjacent to a second side of the memory cell array, the second active internal voltage generating circuit including a second comparator:
arranging first driver adjacent to the first side of the memory cell array, an output of the first driver coupled to a first end of one of the internal voltage generating lines, an output of the first comparator coupled to an input of the first driver: and
arranging a second driver adjacent to the second side of the memory cell array, an output of the second driver coupled to a second end of the one of the internal voltage generating lines, an output of the second comparator coupled to an input of the second driver.

10. The method of claim 9, wherein arranging the first driver and arranging the second driver comprises:
coupling a first external voltage pad to another input of the first driver, the first external voltage pad configured to be electrically connected to an external voltage:
coupling a second external voltage pad to another input of the second driver, the second external voltage pad configured to be electrically connected to the external voltage.

11. The method of claim 10, further comprising:
coupling the first external voltage pad to a first external voltage pin; and coupling the second external voltage pad to a second external voltage pin.

12. A method comprising:

directly coupling an output of a first comparator in a first active internal voltage circuit to an input of a first driver;

coupling an output of the first driver to a first end of an internal voltage generating line that is structured to supply an internal voltage to a memory cell array block;

directly coupling an output of a second comparator in a second active internal voltage circuit to an input of a second driver; and coupling an output of the second driver to a second end of the internal voltage generating line.

13. The method of claim 12, further comprising:

simultaneously driving the internal voltage generating line with the first driver and the second driver.

14. The method of claim 12, further comprising:

supplying an external voltage to the first driver using a first external voltage pad; and supplying the external voltage to the second driver using a second external voltage pad.

15. The method of claim 12, wherein coupling the first driver and coupling the second driver comprises:

arranging the first driver and the second driver between two column selecting lines.

* * * * *

UNITED STATES PATENT AND TRADEMARK OFFICE
CERTIFICATE OF CORRECTION

PATENT NO. : 7,075,849 B2
APPLICATION NO. : 10/786855
DATED : July 11, 2006
INVENTOR(S) : Soo-Bong Chang et al.

It is certified that error appears in the above-identified patent and that said Letters Patent is hereby corrected as shown below:

Column 8, line 45, the word "comparator:" should read -- comparator; --;
Column 8, line 50, the word "driver:" should read -- driver; --;
Column 8, line 60, the word "voltage:" should read -- voltage; --;
Column 9, line 6, the word "driver:" should read -- driver; --.

Signed and Sealed this

Fourth Day of August, 2009

JOHN DOLL
*Acting Director of the United States Patent and Trademark Office*